United States Patent
Anderson

(10) Patent No.: US 6,560,554 B1
(45) Date of Patent: May 6, 2003

(54) AUTOMATIC TESTING

(75) Inventor: Duwayne R. Anderson, St. Helens, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/689,207

(22) Filed: Oct. 11, 2000

Related U.S. Application Data

(60) Provisional application No. 60/159,008, filed on Oct. 11, 1999.

(51) Int. Cl.$^7$ .................................. G06F 19/00
(52) U.S. Cl. .................... 702/108; 702/119; 702/121; 702/123
(58) Field of Search ................ 702/108, 119, 702/120, 121, 123; 324/500, 76.11

(56) References Cited

U.S. PATENT DOCUMENTS

| | | | | |
|---|---|---|---|---|
| 5,036,479 A | * | 7/1991 | Prednis et al. | 324/158.1 |
| 5,115,407 A | * | 5/1992 | Bird et al. | 324/73.1 |
| 5,206,582 A | * | 4/1993 | Ekstedt et al. | 324/158.1 |
| 5,251,150 A | * | 10/1993 | Ladner et al. | 702/127 |
| 5,414,639 A | * | 5/1995 | Sugimoto et al. | 324/73.1 |
| 5,543,727 A | * | 8/1996 | Bushard et al. | 324/158.1 |
| 5,777,873 A | * | 7/1998 | Cox et al. | 209/552 |
| 5,845,234 A | * | 12/1998 | Testa et al. | 702/119 |
| 5,856,929 A | * | 1/1999 | McClendon et al. | 702/114 |
| 5,963,565 A | * | 10/1999 | Rezvani et al. | 702/123 |
| 6,128,759 A | * | 10/2000 | Hansen | 700/121 |
| 6,269,319 B1 | * | 7/2001 | Neisch et al. | 702/118 |
| 6,279,131 B1 | * | 8/2001 | Archambeau et al. | 714/737 |
| 6,349,274 B1 | * | 2/2002 | Kay et al. | 703/13 |
| 6,351,112 B1 | * | 2/2002 | Felps et al. | 324/158.1 |
| 6,405,145 B1 | * | 6/2002 | Rust et al. | 702/121 |
| 2002/0055834 A1 | * | 5/2002 | Andrade et al. | 703/27 |

OTHER PUBLICATIONS

Oblad, "Achieving Robust Interchangeability of Test in ATE Systems", 1999.*

* cited by examiner

Primary Examiner—Patrick Assouad
(74) Attorney, Agent, or Firm—Francis I. Gray

(57) ABSTRACT

A method of automatic testing of systems, such as DWDM systems with an OSA, has manufacturer's specifications loaded into the test equipment for a plurality of systems. A user selects one of the systems from a menu, and the test equipment from the manufacturer's specification for the selected system automatically acquires data and makes measurements on the data. The results of the data are summarized in a report which indicates an overall system status, indicating where and why the system failed if any of the measurements indicates the system is out of the manufacturer's specifications. The measurements are kept so that they may be used to determine drift when the system is tested the next time.

4 Claims, 2 Drawing Sheets

SYSTEM TEST FOR CIENA MULTIWAVE SENTRY™ 4000
SYSTEM FAILURE
LOCATION: CHANNEL AT 193.6 THz
REASON: OSNR IS OUT OF SPECIFICATION

| PARAMETERS | SYSTEM SPECIFICATIONS | MEASURED PERFORMANCE |
|---|---|---|
| MAX. NO. OF CHANNELS | 40 | 8 CHANNELS ACTIVE |
| MIN. CHANNEL SPACING | 50 GHz | 100 GHz |
| MAX. OPTICAL PWR @ RCVR | −15 dBm | −18 dBm @ 193.1 THz |
| MIN. OPTICAL PWR @ RCVR | −35 dBm | −19.2 dBm @ 193.7 THz |
| MAX. TILT | 0.2 dB/nm | 0.12 dB/nm |
| MIN. OSNR | 17 dB | 16 dB @ 193.6 THz |
| MAX. FREQ. OFFSET IN CHANNEL | 3 GHz | 2.2 GHz @ 193.2 THz |
| MAX. FREQ. DRIFT FROM LAST TEST | NA | 0.5 GHz @ 193.2 THz |
| MAX. PWR. DRIFT FROM LAST TEST | NA | 0.5 dB @ 193.7 THz |
| MAX. OSNR CHANGE FROM LAST TEST | NA | 1.3 dB @ 193.6 THz |

OPERATOR: JOHN SMITH
DATE: 1 SEPTEMBER 1999
LAST TEST: JUNE 1999
NOTES: TAKEN AT <LOCATION>

SELECT:

• MANUAL TEST

• AUTOMATIC TEST & REPORT GENERATION

SYSTEM TEST FOR CIENA MULTIWAVE SENTRY™ 4000
SYSTEM FAILURE
LOCATION: CHANNEL AT 193.6 THz
REASON: OSNR IS OUT OF SPECIFICATION

| PARAMETERS | SYSTEM SPECIFICATIONS | MEASURED PERFORMANCE |
|---|---|---|
| MAX. NO. OF CHANNELS | 40 | 8 CHANNELS ACTIVE |
| MIN. CHANNEL SPACING | 50 GHz | 100 GHz |
| MAX. OPTICAL PWR @ RCVR | −15 dBm | −18 dBm @ 193.1 THz |
| MIN. OPTICAL PWR @ RCVR | −35 dBm | −19.2 dBm @ 193.7 THz |
| MAX. TILT | 0.2 dB/nm | 0.12 dB/nm |
| MIN. OSNR | 17 dB | 16 dB @ 193.6 THz |
| MAX. FREQ. OFFSET IN CHANNEL | 3 GHz | 2.2 GHz @ 193.2 THz |
| MAX. FREQ. DRIFT FROM LAST TEST | NA | 0.5 GHz @ 193.2 THz |
| MAX. PWR. DRIFT FROM LAST TEST | NA | 0.5 dB @ 193.7 THz |
| MAX. OSNR CHANGE FROM LAST TEST | NA | 1.3 dB @ 193.6 THz |

OPERATOR: JOHN SMITH
DATE: 1 SEPTEMBER 1999
LAST TEST: JUNE 1999
NOTES: TAKEN AT <LOCATION>

FIG.3

AUTOMATIC TESTING

CROSS-REFERENCE TO RELATED APPLICATIONS

This application is a nonprovisional application claiming the benefit of the filing date of provisional U.S. Patent Application Serial No. 60/159,008, filed Oct. 11, 1999.

BACKGROUND OF THE INVENTION

The present invention relates to the measurement of optical signals, and more particularly to the automatic testing of dense wavelength division multiplexing (DWDM) systems.

A new type of technology has emerged over the last few years in the telecommunications industry. This technology is called dense wavelength-division multiplexing (DWDM) and combines multiple optical channels onto a single optical fiber, each channel transmitting at a slightly different wavelength. This technology thus multiplies the carrying capacity of a single optical fiber by as much as two orders of magnitude. While greatly enabling the transport of large amounts of data over optical fiber, DWDM adds a level of complexity not seen in earlier transmission systems. In the past telecommunications technicians were largely unconcerned about spectral measurements, but with the advent of DWDM such measurements become critical. This has the unintended effect of thrusting the technicians into a mode requiring testing with optical spectrum analyzers (OSAs).

Traditionally optical spectrum analyzers have been large, cumbersome machines with complicated user interfaces designed for specialist engineers. Emphasis was on flexibility and raw performance, in much the same way that early optical time domain reflectometers (OTDRs) were designed primarily for engineers. Today expectations for test equipment have radically changed, and ease of use is a key requirement. This expectation derives from the fact that telecommunications operators have cut back on technician staff. No longer are technicians allowed the luxury of being specialists on one type of equipment. Instead they must be able to competently use many different types of equipment. To do this much of the testing intelligence must now be built into the test equipment. The ideal user interface is one that requires the operator to connect the equipment and push a single button. The results, rather than being just data that the user must interpret, should be in the form of conclusions about the system being tested with higher-level functionality residing behind this simple user interface.

Today technicians want to know if their DWDM optical network is operating within performance specifications. Many would be happy with a simple "yes" or "no" answer. To get this answer they must operate the OSA, meaning they must supply acquisition parameters. Next they must interpret a waveform and/or event tables and from that information draw a conclusion—is the system operating within specification or not? Setup parameters may include entering such information as: start/stop wavelengths; center wavelength and span; sensitivity level; saturation level; and resolution bandwidth. Once the waveform is acquired the user often wants to know the answers to the following questions:

How many channels are operating?
Are all channels operating with specification?
  Are the channels properly centered in the ITU grid?
  Are the channels sufficiently equal in magnitude?
  Are any channels below the minimum acceptable power level?
  Are any channels above the maximum acceptable power level?
  Is the OSNR within specification for each channel?
  Is there excessive gain tilt in the system?
  Have any channels drifted appreciably in power or frequency since the last test?

As is apparent there is a wealth of information that must be available to the user in order to make these assessments. Furthermore the user needs to have a detailed familiarity with the instrument just to make an acquisition. If the measurements are not made automatically, the user must also have considerable experience in using the instrument in order to get full value out of the measurements made.

What is desired is an OSA for technicians that has a very simple user interface which selects the acquisition parameters and makes a report describing system-level compliance with specifications based on automatic testing of the OSA waveform.

BRIEF SUMMARY OF THE INVENTION

Accordingly the present invention provides automatic testing of DWDM systems that provides a test solution which allows technicians quick access to the most important question: do the spectral characteristics of the DWDM system meet the manufacturer's specifications. Upon turning on an optical spectrum analyzer (OSA) and connecting it to the DWDM system, the OSA presents the user with the option of manual or automatic testing. Selection of the automatic testing provides a menu listing all the major DWDM systems, the specifications for which supplied by the manufacturers is stored in the OSA's updatable memory. Selection of the appropriate DWDM system from the menu automatically configures the OSA's acquisition parameters, initiates a test sequence and generates a report telling the user whether the system is meeting all its specifications and, if not, where the problem is.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 3 is an illustrative plan view of an instrument screen providing a user with a report of the automatic testing according to the present invention.

DETAILED DESCRIPTION OF THE INVENTION

Figure 1:
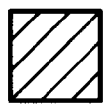
FIG. 1 is a plan view of an instrument screen providing a user with options for the instrument according to the present invention.
Figure 1:
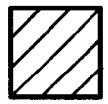

As shown in FIG. 1 initially a user is presented with a selection option, either in the form of buttons on a display screen or hard buttons on the front panel of a measurement instrument, such as an optical spectrum analyzer (OSA). If the user is experienced, "Manual" may be selected and the user enters appropriate parameters for optical data acquisition, determines what measurements are made in an event table and/or makes manual measurements with cursors on a waveform representing the data acquired. However for the less experienced user "Automatic Test" may be selected.

Figure 2:
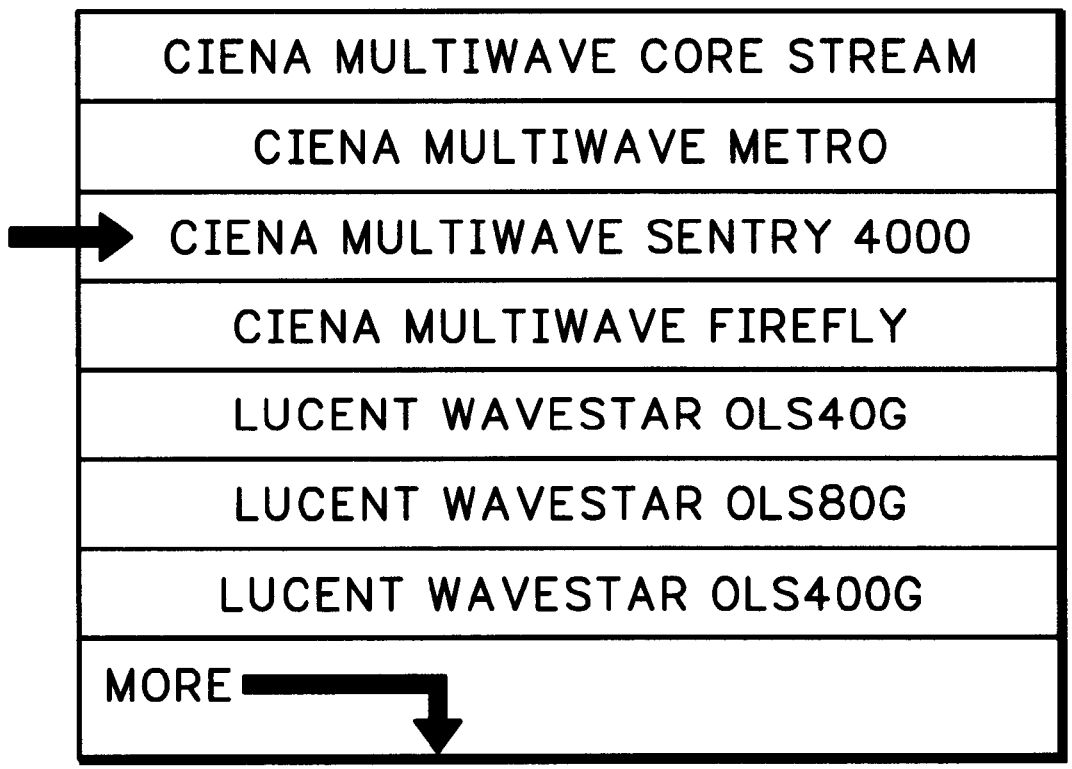
FIG. 2 is a plan view of an instrument screen providing a user with a menu of systems for automatic testing according to the present invention.

When "Automatic Test" is selected, then the screen display shown in FIG. 2 appears. This screen display has an entry for each major DWDM system which the user may be apt to test. The specifications for each of the systems, as provided by the manufacturers, is stored in memory in the OSA. If the number of DWDM systems is greater than the displayed menu, an entry for "More" may be accessed to bring up another page of the menu with additional DWDM systems specified. The user moves a cursor, turns a knob, or otherwise indicates which DWDM system from the menu is being tested. An arrow, highlighting or other suitable means is used to indicate which system is selected. When the system is selected from the menu, appropriate specification data is accessed from the memory corresponding to the selected system. The specification data is used to automatically configure the acquisition parameters for the OSA and initiates a test sequence for the system. The received data is then processed by the OSA and a report is generated and displayed, either on the screen, on a printout or by other suitable means.

Referring now to FIG. 3 a typical report generated automatically by the OSA is shown for a particular selected DWDM system. Such a report may include a synopsis section, indicating the type of system being tested—"CIENA MultiWave Sentry™4000"—and an overall result—"System Failure". If there is a system failure, the synopsis also may indicate where the failure occurred—"Channel at 193.6 THz"—and the reason for the failure—"OSNR is out of specification". Additionally the report may include a detailed results table section that lists the system parameters measured, the system specification from the OSA memory, and the actual measured performance. As can be seen the particular measured value that is out of specification may be highlighted in some manner using different grey scale levels or color, using a reverse image, or the like. In this example the minimum optical signal-to-noise ratio (OSNR) is at 16 dB at 193.6 THz where the specification minimum value is 17 dB. Additional information may be provided as entered by the user, such as the user's name, date of test, location of test and from the memory of the OSA the date last tested. The measured results are stored in memory together with the date so that the drift measurements, indicated at the last three entries in the table, may be computed.

Although the present invention is described with respect to an OSA and the measurement of DWDM systems, it is equally applicable to other test equipment designed for making measurements of other types of network systems. The basic idea is to have the manufacturer's specifications for each system to be measured built into the test equipment. Additional specifications may be downloaded into the test equipment as new systems become operational or current systems are updated resulting in new specifications, either by loading via a floppy disk or by downloading from a worldwide Web site or other suitable means. The measurements are performed automatically upon the user selecting the automatic test feature, loading appropriate parameters for data acquisition and analyzing the resulting data to provide a report of the condition of the system and what is keeping the system out of specification. A running account is kept of all measurements on a given system to provide drift information for the report.

What is claimed is:

1. A method of automatic testing of a system comprising the steps of:
   loading manufacturer's specifications for each of a plurality of types of systems into a test equipment;
   selecting one of the plurality of types of systems as the system to be automatically tested;
   performing data acquisition and measurements on received data by the test equipment of the system without user intervention; and
   providing a report of the status of the system by the test equipment automatically to indicate whether the system is within the manufacturer's specifications.

2. The method as recited in claim 1 wherein the report indicates for a system failure, where the system is outside the manufacturer's specifications, the location and reason for the system failure.

3. The method as recited in claim 1 further including the step of updating the manufacturer's specifications in the test equipment when a new type of system becomes operational or a current type of system is updated in such a manner as to change the manufacturer's specifications.

4. The method as recited in claim 1 wherein the measurements are retained to provide drift data in the report for subsequent tests of the system.

* * * * *